(12) United States Patent
Fujimoto et al.

(10) Patent No.: US 9,324,914 B2
(45) Date of Patent: Apr. 26, 2016

(54) SEMICONDUCTOR LIGHT-EMITTING DEVICE AND PROCESS FOR PRODUCTION THEREOF

(75) Inventors: Akira Fujimoto, Kawasaki (JP); Ryota Kitagawa, Tokyo (JP); Koji Asakawa, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 1014 days.

(21) Appl. No.: 12/712,693

(22) Filed: Feb. 25, 2010

(65) Prior Publication Data
US 2011/0049556 A1 Mar. 3, 2011

(30) Foreign Application Priority Data
Aug. 31, 2009 (JP) .................................. 2009-199416

(51) Int. Cl.
*H01L 33/00* (2010.01)
*H01L 33/38* (2010.01)
*H01L 33/40* (2010.01)

(52) U.S. Cl.
CPC ................. *H01L 33/38* (2013.01); *H01L 33/40* (2013.01); *H01L 2933/0083* (2013.01)

(58) Field of Classification Search
USPC ......... 257/79, 81, 97–99, 102, 130, 613, 615, 257/745, 762, 768, 918, E33.067, E33.068; 438/22, 26, 29, 46, 47; 315/291; 362/97.1
See application file for complete search history.

(56) References Cited

U.S. PATENT DOCUMENTS

| | | | | |
|---|---|---|---|---|
| 4,546,009 A | * | 10/1985 | Tiedje et al. | ............. 438/485 |
| 6,903,374 B2 | | 6/2005 | Katayama | |
| 6,998,649 B2 | * | 2/2006 | Hata | ............. 257/99 |
| 8,334,547 B2 | | 12/2012 | Tsutsumi et al. | |
| 2006/0226429 A1 | | 10/2006 | Sigalas | |
| 2008/0303409 A1 | * | 12/2008 | Hirosaki | ............. 313/503 |
| 2009/0211783 A1 | | 8/2009 | Tsutsumi et al. | |
| 2009/0242925 A1 | | 10/2009 | Kitagawa et al. | |
| 2009/0278158 A1 | * | 11/2009 | Fukunaga | ...... H01L 33/42 257/99 |

FOREIGN PATENT DOCUMENTS

| | | |
|---|---|---|
| JP | 62-141788 | 6/1987 |
| JP | 2001-148511 | 5/2001 |
| JP | 2004-55646 A | 2/2004 |

(Continued)

OTHER PUBLICATIONS

U.S. Appl. No. 13/221,319, filed Aug. 30, 2011, Masunaga, et al.
U.S. Appl. No. 13/222,281, filed Aug. 31, 2011, Asakawa et al.

(Continued)

*Primary Examiner* — Meiya Li
(74) *Attorney, Agent, or Firm* — Oblon, McClelland, Maier & Neustadt, L.L.P.

(57) ABSTRACT

A semiconductor light-emitting device capable of keeping high luminance intensity even if electric power increases, and suitable for lighting instruments such as lights and lamps. The semiconductor device includes a metal electrode layer provided with openings, and is so large in size that the electrode layer has, for example, an area of 1 mm² or more. The openings have a mean diameter of 10 nm to 2 μm, and penetrate through the metal electrode layer. The metal electrode layer can be produced by use of self-assembling of block copolymer or by nano-imprinting techniques.

4 Claims, 9 Drawing Sheets

(56) References Cited

FOREIGN PATENT DOCUMENTS

JP    2006-294617 A    10/2006
JP    2009-76361       4/2009

OTHER PUBLICATIONS

Motokazu Yamada, et al., "InGaN-Based Near-Ultraviolet and Blue-Light-Emitting Diodes with High External Quantum Efficiency Using a Patterned Sapphire Substrate and a Mesh Electrode", The Japan Society of Applied Physics, vol. 41, Part 2, No. 12B, Dec. 15, 2002, pp. L1431-L1433.

Japanese Office Action issued Mar. 15, 2013 in Patent Application No. 2009-199416 with English Translation.

Office Action issued Aug. 2, 2013 in Japanese Patent Application No. 2009-199416 (with English-language translation).

Office Action mailed Feb. 18, 2014 in Japanese Application No. 2009-199416 filed Aug. 31, 2009 (w/English translation).

Japanese Office Action issued Sep. 12, 2014, in Japan Patent Application No. 2013-21612 (with English translation).

* cited by examiner

US 9,324,914 B2

SEMICONDUCTOR LIGHT-EMITTING DEVICE AND PROCESS FOR PRODUCTION THEREOF

CROSS-REFERENCE TO RELATED APPLICATION

This application is based upon and claims the benefit of priority from the prior Japanese Patent Application No. 2009-199416, filed on Aug. 31, 2009; the entire contents of which are incorporated herein by reference.

BACKGROUND OF THE INVENTION

1. Field of the Invention

This invention relates to a semiconductor light-emitting device comprising a metal electrode provided with openings. In detail, the present invention relates to a semiconductor light-emitting device improved in luminance properties.

2. Background Art

Recently, semiconductor light-emitting devices have been studied for application to displays or to lighting instruments such as lights and lamps. The semiconductor light-emitting device generally comprises electrodes and a semiconductor layer placed between them, and emits luminescence when electric current flows between the electrodes. Normally, the device has a pad electrode in ohmic contact with the semiconductor layer, and the luminescence is given off from the periphery of the pad electrode when the electric current flows. If used as a light or the like, the light-emitting device is preferred to be relatively large. However, enlarging the pad electrode is not effective in expanding the light-emitting part, and hence, practically a fine wire electrode is additionally put from the pad electrode along the semiconductor layer surface so that the light-emitting part can be expanded. On the other hand, if the fine wire electrode is extended, it generally has a problem of making the electrode structure complicated.

From the viewpoint of application to lighting instruments, it can be also considered to supply an enough amount of electric current for the devices to enhance the luminance intensity. In a conventional semiconductor light-emitting device comprising the pad electrode, the luminance intensity increases according as the electric current increases until a certain value but then the intensity reaches the peak at the certain current value. Even if the current increases more than that value, the luminance intensity does not increase but decreases. A large reason of this is because much electric current flows in the device to generate heat and the heat is not sufficiently cooled. Accordingly, in order to enhance the luminance intensity of a conventional device, it is necessary to cool the device sufficiently. To cope with this problem, it is proposed to provide a heat-sinking substrate on the bottom of the device. However, that is not very effective at present probably because the substrate is positioned too far from the heated part.

JP-A 2009-076361 (KOKAI) discloses that a metal electrode provided with openings can be employed in the semiconductor light-emitting device. However, this publication focuses on small light-emitting devices applicable to LEDs and the like, and hence is silent about large devices usable as lights and the like. Further, in the publication, there is no description of the above problems such as the heat generation and the luminance deterioration.

SUMMARY OF THE INVENTION

One aspect of the present invention resides in a semiconductor light-emitting device comprising:

a crystal substrate;
an electrode layer provided on one surface of the substrate;
a compound semiconductor layer provided on a substrate surface positioned on the side opposite to the electrode layer; and
a metal electrode layer which is provided on the compound semiconductor layer and which has a thickness of 10 nm to 200 nm;

wherein the metal electrode layer comprises
a metal part so continuous that any pair of point-positions therein is continuously connected without breaks, and
plural openings which penetrate through the metal electrode layer, which have a mean diameter of 10 nm to 2 μm and which are arranged so periodically that the distribution of the arrangement is represented by a radial distribution function curve having a half-width of 5 to 300 nm.

Another aspect of the present invention resides in a process for production of the above semiconductor light-emitting device, comprising the steps of:

forming a compound semiconductor layer on a crystal substrate,
forming a metal electrode layer on the compound semiconductor layer, and
forming a counter electrode layer on the crystal substrate on the side opposite to the compound semiconductor layer;

wherein the step of forming a metal electrode layer further comprises:

forming a metal thin layer,
coating at least one part of the metal thin layer with a composition containing a block copolymer, to form a block copolymer layer,
causing phase separation of the block copolymer to form dot-patterned microdomains in the form of a dot pattern, and
etching the metal thin layer by use of the microdomains as an etching mask, to form the metal electrode layer provided with openings.

Still another aspect of the present invention resides in a process for production of the above semiconductor light-emitting device, comprising the steps of:

forming a compound semiconductor layer on a crystal substrate,
forming a metal electrode layer on the compound semiconductor layer, and
forming a counter electrode layer on the crystal substrate on the side opposite to the compound semiconductor layer;

wherein the step of forming a metal electrode layer further comprises:

forming a metal thin layer,
preparing a stamper whose surface has a fine relief pattern corresponding to the shape of the metal electrode intended to be formed
transferring a resist pattern onto at least one part of the metal thin layer by use of the stamper, and
forming openings on the metal thin layer by use of the resist pattern as an etching mask.

The light-emitting device of the present invention has a metal electrode covering the whole surface of the light-emitting part, and hence heat generated from inside of the device can be effectively dissipated via the metal electrode. Accordingly, even if much electric current flows in the device, the luminance intensity is not lowered. This means that the luminance intensity does not change or increases when the electric current increases. The metal electrode covering the whole light-emitting part also makes it possible to reduce series resistance of the device itself and hence to lower forward voltage thereof, so that the device less generates heat. This is also advantageous to enhance the luminance intensity. Consequently, the present invention provides a semiconductor light-emitting device whose luminance intensity is not lowered even if much electric current flows therein. This light-emitting device has properties of showing high luminance when used as a lighting instrument.

DETAILED DESCRIPTION OF THE INVENTION

Figure 1:
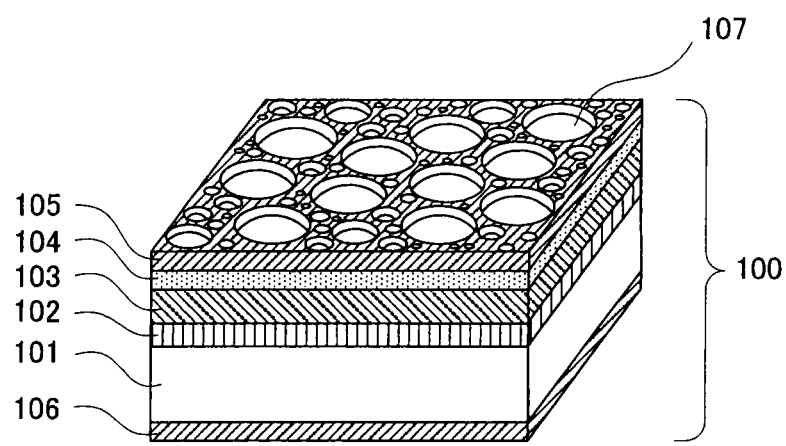
FIG. 1 conceptually illustrates the structure of the semiconductor light-emitting device according to the present invention.

Embodiments of the present invention are described below in detail.

The semiconductor light-emitting device according to the present invention is particularly characterized by the structure of the metal electrode layer formed on the light-extraction side. The device of the present invention is relatively large in size, and the metal electrode layer thereof has, for example, an area of 1 mm$^2$ or more. In the present invention, the compound semiconductor layer can be fully covered with the metal electrode layer. Accordingly, the size of the device can be set the same as that of the metal electrode layer. In other words, it is possible to produce a semiconductor light-emitting device (chip) of 1 mm$^2$ or more. Known semiconductor light-emitting devices used in displays and the like are generally 0.1 mm$^2$ or less in size, and it is difficult to produce larger devices particularly if they comprise conventional pad electrodes. In contrast, the larger the device is, the more strongly the heat-sinking effect emerges in the present invention. The device of the present invention is, therefore, preferred to have the metal electrode layer have an area of 1 mm$^2$ or more.

There is no particular restriction on material metal of the metal electrode layer in the present invention, as long as it has sufficient electro- and heat-conductivity. Accordingly, any metals generally used in electrodes can be adopted. However, in view of cost and treatability, the metal electrode layer is preferably made of at least one metal or an alloy selected from the group consisting of Au, Ag, Al, Zn, Zr, Ge, Pt, Ni, W, Pd and Rh.

As described above, the device according to the present invention comprises the metal electrode layer of relatively large size. The metal electrode layer is provided with plural openings penetrating through the layer. Further, since having high heat-dissipating ability, the metal electrode layer of relatively large size cools the device to prevent the device temperature from increasing. In addition, the device temperature can be also controlled by adjusting the size of the openings. This means that the series resistance can be reduced by lowering the forward voltage of the device so as to diminish the heat generation itself. In order to obtain this effect, it is necessary that the electric current should flow evenly to the whole surface of the compound semiconductor layer from the metal electrode layer provided with the openings. This necessity restricts the sizes of the openings and the center-to-center intervals among them to certain degrees. Researches based on calculation such as simulation indicate that the current flows in the area within approx. 2 μm from the edge of the metal electrode layer although it depends on the doping concentration of the semiconductor layer in which the current travels. Accordingly, if the openings have diameters larger than that, areas appear where the current does not flow. As a result, the series resistance cannot be reduced and hence it is impossible to lower the forward voltage. In fact, as for semiconductor light-emitting devices comprising metal electrodes of net structure having 5 μm or more mesh, there is no report that the forward voltage is lowered (see, Jpn. J. Appl. Phys. Vol. 41 (2002) pp. L 1431-L 1433). The openings, therefore, have a mean diameter of 2 μm or less, preferably 1 μm or less. On the other hand, there is no restriction on the lower limit of the diameter from the viewpoint of the resistance, but in consideration of production easiness the mean diameter is generally 10 nm or more, preferably 30 nm or more.

The metal electrode layer of the present invention comprises a metal part, and the metal part must be so continuous that any pair of point-positions therein is continuously connected without breaks. This is essential for keeping the resistance low, as described above.

The continuity of the metal part is also significant so that the device can emit luminescence from the whole compound semiconductor layer. The metal electrode layer has a sheet resistance of preferably 10 Ω/□ or less, more preferably 5 Ω/□ or less. The smaller the sheet resistance is, the less the device generates heat and hence the more remarkably the effect of the present invention emerges.

In general, a metal electrode is formed on the semiconductor layer by the steps of: forming a metal layer on the semiconductor layer, and then doping a dopant into the interface between the metal layer and the semiconductor layer via heat treatment to form ohmic contact. For example, in producing a normal red light-emitting device, the process for forming an electrode comprises the steps of: forming a layered structure of Au/Au—Zn (dopant used in the p-layer) on a compound semiconductor layer of GaAs, GaP or the like, and then doping Zn into the metal-semiconductor interface to form ohmic contact. In the present invention, a metal layer is formed in the same manner and subsequently openings are provided thereon in the manner described later, to form the metal electrode layer. If the metal electrode layer is too thin, the amount of the dopant is often too small to guarantee sufficient doping. As a result, sufficient ohmic contact cannot be realized and accordingly the resistance increases. Our experiments reveal that the metal electrode layer must have a thickness of 10 nm or more, preferably 30 nm or more, so as to obtain sufficient ohmic contact. On the other hand, there is no restriction on the upper limit of the thickness from the viewpoint of the resistance, but in consideration of production easiness and fabrication precision the thickness is generally up to approximate 200 nm, preferably 100 nm or less.

The metal electrode layer according to the present invention is provided on the light-extraction side of the device, and hence light emitted from the semiconductor layer is given off through the metal electrode layer. Accordingly, for ensuring high luminance, the metal electrode layer preferably has high light-transmittance, which is preferably 10% or more. Needless to say, the transmittance here is measured at the wavelength of the light emitted from the semiconductor layer.

For the purpose of increasing the light-transmittance of the metal electrode layer, it can be considered to increase the opening ratio, namely, the ratio of the area occupied by the openings based on the whole metal electrode area. On the other hand, however, a high opening ratio is disadvantageous in keeping the surface resistance at a low value. In consideration of that, the opening ratio is preferably 50 to 70%, more preferably 40 to 50%.

Further, the sizes and arrangement of the openings can be so controlled that the metal electrode layer can have a light transmittance more than expected from the opening ratio. This technique is disclosed in, for example, JP-A 2009-076361 (KOKAI). As described in the publication, it is preferred that 90% or more of the metal part in the metal electrode layer should continue linearly without interception by the openings in a straight length of not more than $\frac{1}{3}$ of the wavelength of light emitted from the semiconductor layer and also that the openings should have an average diameter in the range of not less than 10 nm and not more than $\frac{1}{3}$ of the wavelength of the emitted light. If having the above structure, the metal electrode layer can have a high light transmittance.

FIG. 1 schematically shows a sectional view of the semiconductor light-emitting device produced by the process according to one aspect of the present invention.

The light-emitting device 100 shown in FIG. 1 comprises a substrate 101 of, for example, n-type GaAs. On the substrate, for example, a hetero structure 102 including an n-type InAlP clad layer, an InGaP active layer and a p-type InAlP clad layer is formed. Further, a current-spreading layer 103 of, for example, p-type InGaAlP is provided thereon. These compound semiconductor sub-layers by no means restrict the constitution of the compound semiconductor layer in the present invention, and the compound semiconductor layer may have any constitution according to necessity. The whole current-spreading layer is covered with a p-side metal electrode layer of Au/Au—Zn provided with openings, and a thin GaAs contact layer 104 is formed between the current-spreading layer and the metal electrode layer so that they can keep in ohmic contact with each other. Particularly if the current-spreading layer comprises various elements, for example, if the current-spreading layer comprises three or more elements such as InGaAlP or AlGaAs, it is difficult without the contact layer to bring the current-spreading layer in sufficient ohmic contact with the metal electrode layer 105 provided thereon. The material of the contact layer depends on the materials of the adjacent layers, namely, the semiconductor of the semiconductor layer and the metal of the metal electrode layer, but is generally GaAs or GaP. The metal electrode layer is provided with plural openings 107 penetrating through the layer. The openings of the metal electrode layer in FIG. 1 have random sizes and are arranged at random, but they by no means restrict the present invention. If necessary, the openings may have the same size and may be regularly arranged. On the opposite surface of the substrate, an n-side counter electrode 106 of, for example, Au is formed. Luminescence emitted by the active layer is extracted from the whole surface of the current-spreading layer 103.

The above semiconductor light-emitting device may be produced by any method. However, since the light-emitting device of the present invention comprises the characteristic metal electrode layer, the production process thereof is characterized by the step of forming the metal electrode layer. On the other hand, however, the other parts such as the compound semiconductor layer and the counter electrode can be formed by any known methods in combination.

The semiconductor light-emitting device according to the present invention can be produced by, for example, the following processes (A) to (D).

(A) Process Employing Self-Assembling of Block Copolymer

The light-emitting device of the present invention can be produced according to a process employing phase separation of block copolymer caused by self-assembling. This process comprises the steps of:

forming a compound semiconductor layer on a crystal substrate, forming a metal electrode layer on a light extraction side of the compound semiconductor layer, and forming a counter electrode layer on the crystal substrate on the side opposite to the light extraction side;

wherein the step of forming a metal electrode layer further comprises the sub-steps of:

forming a metal thin layer, coating at least one part of the metal thin layer with a composition containing a block copolymer, to form a block copolymer layer, causing phase separation of the block copolymer to form microdomains in the form of a dot pattern, and etching the metal thin layer by use of the dot-patterned microdomains as an etching mask, to form a light-extraction side metal electrode layer provided with openings.

This process is explained below more in detail. First, a compound semiconductor layer is formed on a crystal substrate. Subsequently, on the crystal substrate surface opposite to the compound semiconductor layer, metals such as Au/Zn are vacuum-deposited to form a counter electrode layer. The crystal substrate, the compound semiconductor layer and the counter electrode layer can be made of any known materials, and can be formed by any known methods. For example, they may be made of the same materials as described above by referring to FIG. 1.

Thereafter, metals such as Au/Zn are vacuum-deposited on the compound semiconductor layer to form a thin metal layer, and then a resist composition is coated and heated on the thin metal layer to form a resist layer.

If necessary, an organic polymer layer is further formed thereon by coating and thermosetting. The organic polymer layer is used for forming a mask for fabrication of the thin metal layer in the step described later. Since the mask is formed by lifting-off of the organic polymer layer, the height of the mask is determined by the thickness of the organic polymer layer. In view of that, the organic polymer layer preferably has a thickness of 50 to 400 nm.

On the organic polymer layer, a composition containing a block copolymer is spin-coated to form a block copolymer layer, which is then baked on a hot-plate to remove the solvent. The copolymer layer is then heat-treated to cause phase separation at a temperature of, for example, 150° C. to 250° C. The block copolymer comprises, for example, polystyrene (hereinafter, referred to as "PS") block and polymethyl methacrylate (hereinafter, referred to as "PMMA") block, so as to form dotted PMMA domains in PS matrix.

The etching rates of PS and PMMA are very different from each other if gases are properly selected in a reactive ion etching (RIE) process. Accordingly, the phase separated PMMA dotted domains can be selectively removed by RIE to form voids, and thereby a mesh pattern of PS can be obtained.

The block copolymer is normally composed of typical polymer components incapable of withstanding the etching applied to the hard substrate, and hence the present embodiment adopts the pattern-transfer method by use of inorganic substance. First, the above voids are filled with an inorganic substance by the coating method or by the physical vapor deposition method. A part of the PS mesh pattern is then removed by RIE to obtain a dotted pattern of the inorganic substance.

Subsequently, the dotted pattern of inorganic substance is transferred by RIE onto the underlying organic polymer layer, to form a pillar pattern of the organic polymer layer. The pillar pattern of the organic polymer layer is then reversed by the lift-off method to form a mask of mesh pattern. The inorganic substance preferably has high etching selectivity to the organic polymer.

Finally, the mesh-patterned mask of inorganic substance is transferred by RIE or by ion milling onto the underlying thin metal layer, to form a metal electrode layer which is provided with openings and which keeps in ohmic contact with the compound semiconductor layer. The process thus produces a semiconductor light-emitting device of the present invention.

(B) Process Employing Nano-Imprinting

The light-emitting device of the present invention can be also produced according a process employing nano-imprinting. This process comprises the steps of:

forming a compound semiconductor layer on a crystal substrate, forming a metal electrode layer on a light extraction side of the compound semiconductor layer, and forming a counter electrode layer on the crystal substrate on the side opposite to the light extraction side;

wherein the step of forming a metal electrode layer further comprises the sub-steps of:

forming a metal thin layer, preparing a stamper whose surface has a fine relief pattern corresponding to the shape of the metal electrode intended to be formed, transferring a resist pattern onto at least one part of the metal thin layer by use of the stamper, and forming openings on the metal thin layer by use of the resist pattern as an etching mask.

This process is explained below more in detail. First, a compound semiconductor layer is formed on a crystal substrate. Subsequently, on the crystal substrate surface opposite to the compound semiconductor layer, a counter electrode layer is formed. These layers can be formed in the same manner as described above.

Thereafter, metals such as Au/Zn are vacuum-deposited on the compound semiconductor layer to form a thin metal layer, and then a resist composition is coated and heated on the thin metal layer to form a resist layer.

Onto the resist layer, a fine relief pattern corresponding to the opening structure defined in the present invention is transferred by use of a stamper as a mold.

The stamper can be produced by, for example, electron beam lithography applied to a quartz plate. The electron beam lithography can form a desired structure on the quartz plate, but this by no means restricts the present invention. In the process for production of the light-emitting device according to the present invention, there is no particular restriction on the materials and micro-fabrication of the stamper. For example, it is possible to prepare the stamper by the above method employing self-assembling of block copolymer or by the later-described method employing fine particles as a mask.

The stamper is put onto the resist layer, if necessary, while the resist layer is heated, and then cooled and released therefrom, so that a pattern in reverse to the relief pattern of the stamper is transferred on the resist layer. In this way, a resist pattern having pillars and openings among them is obtained.

The present invention is not restricted to the thermal nano-imprinting process described above. Various imprinting techniques such as photo imprint and soft imprint can be used to form the above pattern, and they by no mean impair the functions of the light-emitting device according to the present invention.

The thin metal layer is subjected to etching by use of the obtained resist pattern as a mask, to bore openings through the thin metal layer. Finally, the resist pattern mask is removed to obtain a semiconductor light-emitting device of the present invention.

(C) Process Employing Fine Particles as a Mask

The light-emitting device of the present invention can be still also produced according to a process employing a monoparticle layer of fine silica particles as a mask. This process comprises the steps of:

forming a compound semiconductor layer on a crystal substrate, forming a metal electrode layer on a light extraction side of the compound semiconductor layer, and forming a counter electrode layer on the crystal substrate on the side opposite to the light extraction side;

wherein the step of forming a metal electrode layer further comprises the sub-steps of:

forming a metal thin layer, coating at least one part of the metal thin layer with a resist composition, to form a resist layer, forming a monoparticle layer of fine particles on the surface of the resist layer, etching the resist layer by use of the monoparticle layer as a mask, to form a resist pattern, filling openings of the resist pattern with an inorganic substance, to form a reverse pattern mask, and boring openings in the metal electrode layer by use of the reverse pattern mask as an etching mask.

This process is explained below more in detail. First, a compound semiconductor layer is formed on a crystal substrate. Subsequently, on the crystal substrate surface opposite to the compound semiconductor layer, a counter electrode layer is formed. These layers can be formed in the same manner as described above.

Thereafter, metals such as Au and Au/Zn are vacuum-deposited on the compound semiconductor layer to form a thin metal layer, and then a resist composition is coated on the thin metal layer to form a resist layer. The resist layer is then surface-treated by a reactive ion etching (RIE) process, to make the surface of the resist layer hydrophilic. This surface treatment improves wettability in coating a dispersion described below.

The resist layer thus formed on the substrate is then coated with a dispersion containing, for example, fine silica particles of 200 nm size, and subjected to anneal treatment and cooled, if necessary, to form a monoparticle layer of silica particles. The diameters and size distribution of the fine particles are properly selected according to the design of the openings.

The obtained monoparticle layer of silica particles is subjected to etching, so that the fine silica particles are etched to reduce their radii and to form gaps among the adjacent particles. This etching is carried out under such conditions that the underlying resist layer is hardly etched. In other words, only the silica particles are etched by use of etching rate difference between the particles and the resist layer, so as to form gaps among the adjacent particles.

Subsequently, the underlying thermosetting resist is etched by use of the remaining fine particles as a mask, to obtain a resist pattern. The obtained pattern has pillars of high aspect ratio at the positions previously occupied by the fine particles in the early step.

The obtained pillar resist pattern is coated with a spin-on-glass (hereinafter, referred to as SOG) solution, followed by heating, so that the gaps among the pillars of the resist pattern are filled with SOG.

Thereafter, the remaining silica particles and excess SOG covering the resist pillar pattern are removed by etching, to form a resist pillar pattern including SOG filling the gaps among the pillars.

The pillars of thermosetting resist are then removed by etching. In this step, a SOG mask having a pattern structure in reverse to the above resist pillar pattern is formed on the metal thin layer.

After that, the metal thin layer is subjected to etching by use of the SOG mask to form a metal electrode layer provided with openings.

Finally, the SOG mask is removed to produce a semiconductor light-emitting device according to an embodiment of the present invention.

(D) Process Employing Electron Beam Lithography

The metal electrode layer provided with openings can be yet also formed by a method employing electron beam lithography. This method can be applied to a process for production of the light-emitting device according to the present invention. That process comprises the steps of:

forming a compound semiconductor layer on a crystal substrate, forming a metal electrode layer on a light extraction side of the compound semiconductor layer, and forming a counter electrode layer on the crystal substrate on the side opposite to the light extraction side;

wherein the step of forming a metal electrode layer further comprises the sub-steps of:

forming a metal thin layer, coating the metal thin layer with an electron beam resist, to form a resist layer, subjecting the resist layer to an electron beam lithographic process in which a pattern corresponding to the shape of the openings intended to be formed is drawn on the resist layer by the electron beams and then developed to form a resist pattern, and etching the metal thin layer by use of the resist pattern as a mask, to bore openings in the layer.

For example, the semiconductor light-emitting device can be produced in the following manner. First, a compound semiconductor layer is formed on a crystal substrate by a desired method, and then a metal thin layer of Au/Au—Zn (3%) is formed on the semiconductor layer by vapor-deposition. Subsequently, the layers are preferably subjected to anneal treatment at 450° C. for 30 minutes so that the metal thin layer can keep in ohmic contact with the current-spreading layer. This anneal treatment achieves good ohmic contact. The Au/Au—Zn layer is then coated with an electron beam resist, to form a resist layer of 300 nm thickness. The resist layer thus formed is subjected to an electron beam lithographic process by use of an electron beam lithographic system, and then developed to form a pattern. Thereafter, the Au/Au—Zn layer is etched by means of an ion-milling machine to bore openings. Finally, a pad electrode for wire bonding is formed on a part of the metal electrode layer. The process thus produces a semiconductor light-emitting device comprising an electrode provided with openings.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

The present invention is further explained in detail by the following examples, in which known semiconductor light-emitting devices comprising conventional metal pad electrodes were compared in properties with devices comprising metal electrodes provided with openings according to the present invention.

Example 1

In accordance with the aforementioned process, a semiconductor light-emitting device was produced. In Example 1, the device was made 300 µm square in size, which is the same as a conventional device, so that the device comprising a metal electrode provided with openings could be evaluated in properties comparatively with a conventional device.

Figure 2A:
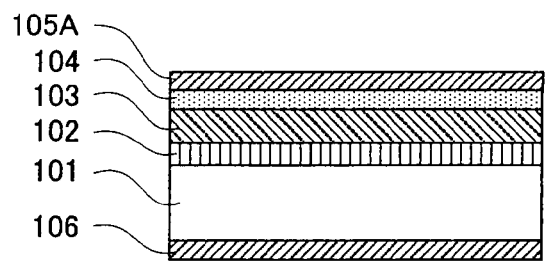
FIG. 2 A to D conceptually illustrate a process for production of the light-emitting device according to the present invention.

As shown in FIG. 2A, a hetero structure 102 including an n-type InAlP clad layer, an InGaP active layer and a p-type InAlP clad layer was formed on an n-GaAs substrate 101. Further, a current-spreading layer 103 of four-elemental p-type InGaAlP was epitaxially grown thereon. On the current-spreading layer thus formed, a p-type GaAs contact layer 104 (0.1 µm) was formed so as to ensure ohmic contact. On the opposite side of the substrate, an n-type counter electrode 106 was provided.

Subsequently, on the p-type GaAs contact layer, a metal thin layer 105A of Au (10 nm)/Au—Zn (3%) (30 nm) was formed by vapor deposition. The formed layer was then annealed at 450° C. for 30 minutes in nitrogen gas atmosphere so as to be brought fully in ohmic contact with the p-type GaAs layer.

Figure 2B:
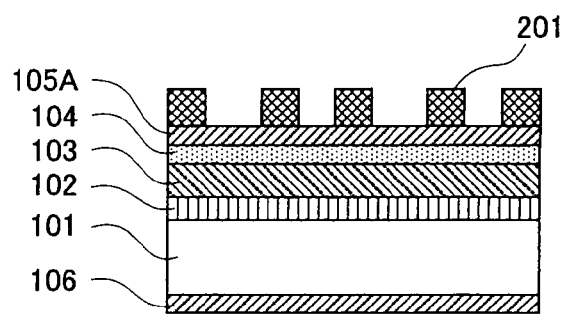

Thereafter, the Au/Au—Zn layer 105A was coated with an electron beam resist (FEP-301 [trademark], manufactured by Fujifilm Corporation) to form a resist layer of 300 nm thickness. The resist layer was then treated by use of an electron beam exposure system (acceleration voltage: 50 kV) equipped with a pattern generator, to form a hole pattern 201 in which the diameter and interval of openings were 100 nm and 200 nm, respectively (FIG. 2B).

Figure 2C:
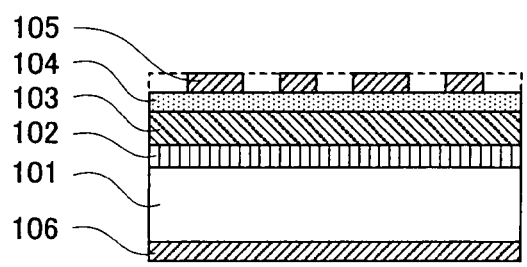
Figure 2D:
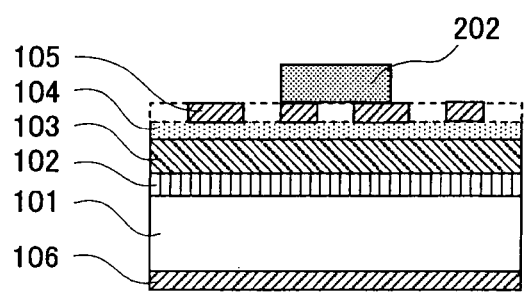

After that, the Au/Au—Zn layer 105A was etched by means of an ion-milling machine for 90 seconds under the conditions that the acceleration voltage and the ion current were 500 V and 40 mA, respectively, to form a metal electrode layer 105 provided with openings. After the etching procedure, the resist was removed by oxygen ashing (FIG. 2C). Finally, a pad electrode 202 was formed to obtain a semiconductor light-emitting device (FIG. 2D).

The obtained device emitted luminescence at 635 nm.

Figure 3:
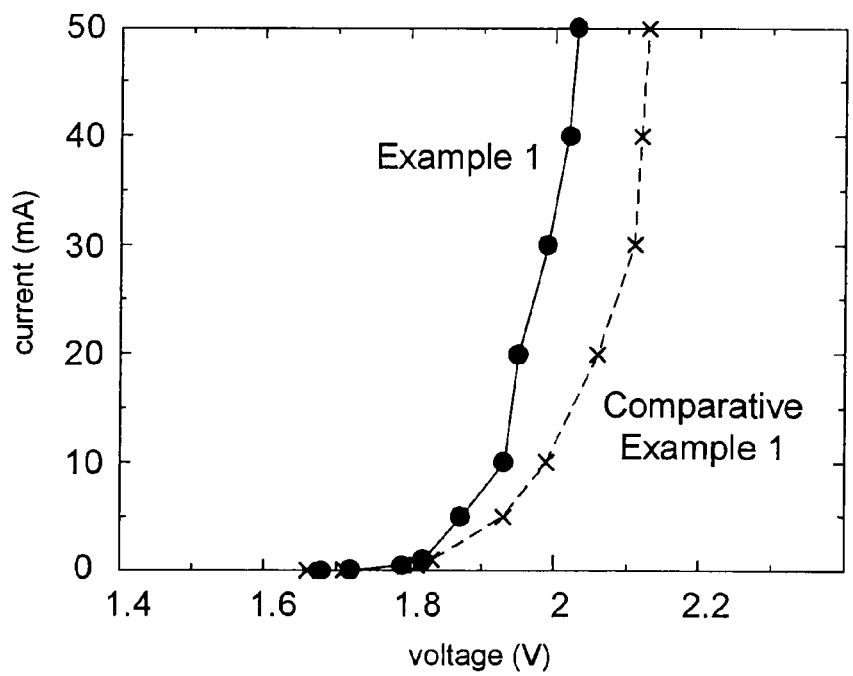
FIG. 3 is a graph showing voltage-current properties of the devices.
Figure 4:
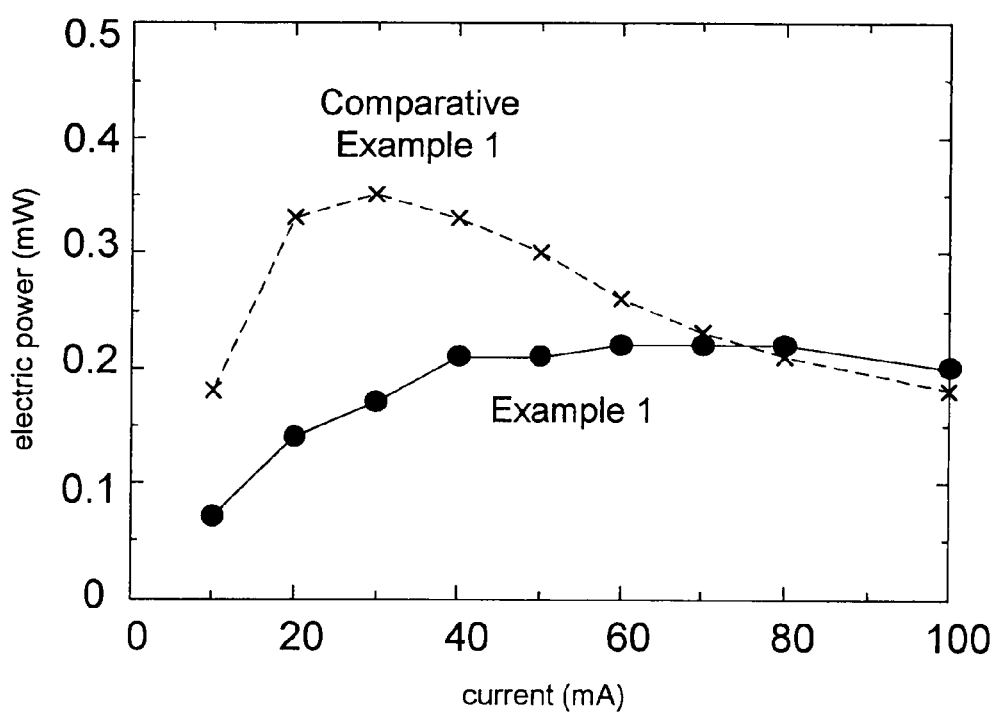
FIG. 4 is another graph showing current-power properties of the devices.

Independently, a comparative semiconductor light-emitting device was produced (Comparative Example 1). In the comparative device, only a pad electrode was formed on the p-type GaAs layer. Each produced device was diced to be 300

μm square in size, and was comparatively evaluated in properties in the form of a bare chip. As a result, voltage-current properties shown in FIG. 3 were obtained. FIG. 3 indicates that the metal electrode provided with openings made the voltage of the device lower than that of the conventional device at the same current. FIG. 4 shows luminance properties in relation to current. As indicated in FIG. 4, the device of the conventional pad electrode gave off brighter luminescence than the device of the electrode provided with openings when the current was as small as a few tens mA. However, according as the current increased, the device of the conventional pad electrode gradually lost the luminance while the device of the electrode provided with openings did not lost but kept the luminance. Finally, the device according to the present invention emitted brighter luminescence than the conventional device at 100 mA. This is because the heat-dissipating ability was improved by the metal electrode covering the whole emitting surface.

Thus, the device comprising the electrode provided with openings was verified to be advantageous when a large amount of current flew therein if the device was in the form of a large chip of 1 mm square size, namely, if the area of the metal electrode layer was as large as 1 mm2 or more. It depends on the area size of the metal electrode layer how much current draws the effect of the present invention, but the effect generally emerges when 100 mA or more of current flows.

Example 2

A semiconductor light-emitting device having the structure of n-GaAs/n-InAlP/InGaP/p-InAlP/p-InGaAlP/p-GaAs, which was similar to the device of Example 1, was prepared. The procedure of Example 1 was repeated to form a metal electrode layer provided with openings.

On the p-type GaAs layer, an Au (10 nm)/Au—Zn (3%) (30 nm) layer was formed by vapor deposition and thereafter annealed at 450° C. for 30 minutes in nitrogen gas atmosphere.

After that, the Au/Au—Zn layer was coated with an electron beam resist in the same manner as in Example 1, and treated by use of a pattern generator to form a hole pattern in which the diameter and interval of openings were 100 nm and 200 nm, respectively.

Subsequently, the Au/Au—Zn layer was etched by means of an ion-milling machine in the same manner as in Example 1, to form a metal electrode layer provided with openings. After the etching procedure, the resist was removed by oxygen ashing. Finally, a pad electrode was formed to obtain a semiconductor light-emitting device.

Independently, a comparative semiconductor light-emitting device was produced (Comparative Example 2). In the comparative device, a pad electrode connected to a fine wire was provided on the p-type GaAs layer. Each produced device was diced to be 1 mm square in size, and was comparatively evaluated in properties in the form of a bare chip. As a result, when the current was 1 A, the forward voltage of the device comprising the electrode provided with openings was 0.2 V smaller than that of the device comprising the fine wire-provided pad electrode. Further, when the current was 500 mA, the device of the electrode provided with openings emitted 1.2 times brighter luminescence than the device of the fine wire-provided pad electrode.

It was thus verified that the device of the present invention, which comprised the electrode provided with openings, was advantageous if the device was in the form of a large chip.

Example 3

Figure 5A:
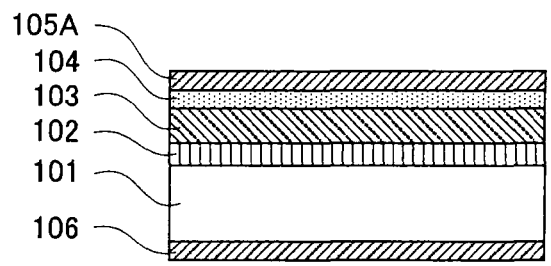
FIG. 5 A to D conceptually illustrate a process for production of the light-emitting device in Example 3.

A semiconductor light-emitting device having the structure of n-GaAs/n-InAlP/InGaP/p-InAlP/p-InGaAlP/p-GaAs, which was similar to the device of Example 1, was prepared. On the p-type GaAs layer 104, a metal thin layer 105A of Au (10 nm)/Au—Zn (3%) (30 nm) was formed by vapor deposition and thereafter annealed at 450° C. for 30 minutes in nitrogen gas atmosphere (FIG. 5A).

Figure 5B:
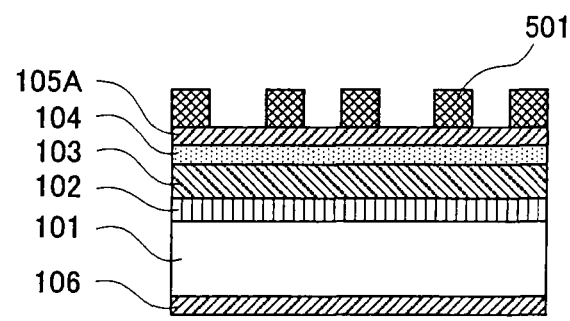

After that, the Au/Au—Zn layer was coated with an i-ray resist (THMR-iP3650 [trademark], manufactured by TOKYO OHKA KOGYO CO., LTD.) to form a resist layer of 1 μm thickness. The resist layer was treated by use of an i-ray stepper exposure system, to form a hole pattern in which the diameter and interval of openings were 500 nm and 1 μm, respectively (FIG. 5B).

Figure 5C:
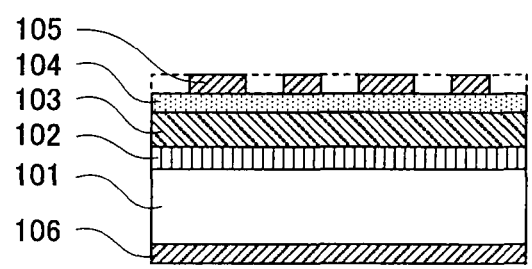
Figure 5D:
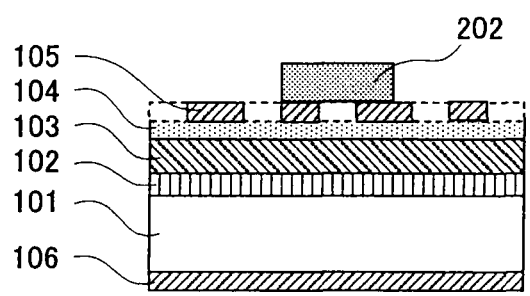

Subsequently, the Au/Au—Zn layer was etched by means of an ion-milling machine in the same manner as in Example 1, to form a metal electrode layer 105 provided with openings. After the etching procedure, the i-ray resist was removed by oxygen ashing (FIG. 5C). Finally, a pad electrode was formed to obtain a semiconductor light-emitting device (FIG. 5D).

Independently, a comparative semiconductor light-emitting device was produced (Comparative Example 3). In the comparative device, a pad electrode connected to a fine wire was provided on the p-type GaAs layer. Each produced device was diced to be 1 mm square in size, and was comparatively evaluated in properties in the form of a bare chip. As a result, when the current was 1 A, the forward voltage of the device comprising the electrode provided with openings was 0.15 V smaller than that of the device comprising the fine wire-provided pad electrode. Further, when the current was 500 mA, the device of the electrode provided with openings emitted 1.15 times brighter luminescence than the device of the fine wire-provided pad electrode.

Example 4

A semiconductor light-emitting device having the structure of n-GaAs/n-InAlP/InGaP/p-InAlP/p-InGaAlP/p-GaAs, which was similar to the device of Example 1, was prepared. On the p-type GaAs layer, a metal thin layer of Au (10 nm)/Au—Zn (3%) (30 nm) was formed by vapor deposition and thereafter annealed at 450° C. for 30 minutes in nitrogen gas atmosphere.

After that, the Au/Au—Zn layer was coated with an i-ray resist in the same manner as in Example 3, to form a resist layer of 1 μm thickness. The resist layer was treated by use of an i-ray stepper exposure system, to form a hole pattern in which the diameter and interval of openings were 1.5 μm and 2 μm, respectively.

Subsequently, the Au/Au—Zn layer was etched by means of an ion-milling machine in the same manner as in Example 1, to form a metal electrode layer provided with openings. After the etching procedure, the i-ray resist was removed by oxygen ashing. Finally, a pad electrode was formed to obtain a semiconductor light-emitting device.

Independently, a comparative semiconductor light-emitting device was produced (Comparative Example 4). In the comparative device, a pad electrode connected to a fine wire was provided on the p-type GaAs layer. Each produced device was diced to be 1 mm square in size, and was comparatively evaluated in properties in the form of a bare chip. As a result, when the current was 1 A, the forward voltage of the device comprising the electrode provided with openings was 0.1 V smaller than that of the device comprising the fine wire-provided pad electrode. Further, when the current was 500 mA, the device of the electrode provided with openings emitted 1.1 times brighter luminescence than the device of the fine wire-provided pad electrode.

Those results revealed that, if the diameter and interval of the openings were increased, the electric current considerably less spread out to impair the improvement of properties.

Example 5

A semiconductor light-emitting device having the structure of n-GaAs/n-InAlP/InGaP/p-InAlP/p-InGaAlP/p-GaAs, which was similar to the device of Example 1, was prepared. On the p-type GaAs layer 104, a metal thin layer 105A of Au (10 nm)/Au—Zn (3%) (30 nm) was formed by vapor deposition and thereafter annealed at 450° C. for 30 minutes in nitrogen gas atmosphere.

After that, the Au/Au—Zn layer 105A was spin-coated at 2000 rpm for 30 seconds with a solution of resist (THMR-iP3250 [trademark], manufactured by TOKYO OHKA KOGYO CO., LTD.) diluted at 1:1 with ethyl lactate (EL), and then heated on a hot-plate at 110° C. for 90 seconds to evaporate the solvent. The resist was annealed at 250° C. in nitrogen gas atmosphere to be thermally hardened. The resist layer 601A thus formed had a thickness of 300 nm.

Figure 6A:
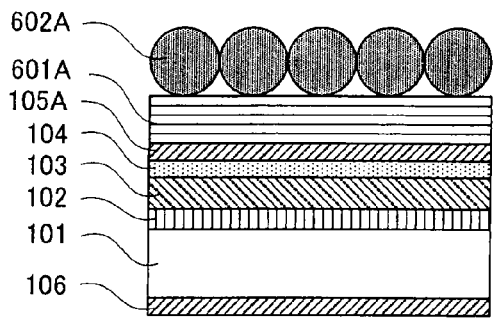
FIG. 6 A to H conceptually illustrate a process for production of the light-emitting device in Example 5.

Independently, silica particles of 200 nm diameter were dispersed in ethyl lactate. The amount of the particles was adjusted to be 8 wt %. Subsequently, acrylic monomer was added to the mixture so that the volume ratio of silica particle: acrylic monomer might be 1:3, to obtain a dispersion. As the acrylic monomer, ethoxylated (6) trimethylolpropane triacrylate (hereinafter, referred to as "E6TPTA") was used. The obtained dispersion was then dropped onto the resist layer formed on the silicon substrate, and spin-coated at 2000 rpm for 60 seconds. After the spin-coating procedure, the solvent was completely removed by baking at 110° C. for 60 seconds. The layer thus formed was then annealed to harden at 150° C. for 1 hour, to form a monoparticle layer in which the silica particles 602A were regularly arranged (FIG. 6A).

Thereafter, the silica particle layer was etched by means of reactive ion etching (RIE) apparatus for 2 minutes under the conditions of $CF_4$ flow: 30 sccm, pressure: 1.33 Pa (10 mTorr) and power: 100 W, and thereby the sizes of the silica particles were reduced to 150 nm (FIG. 6B) to form gaps among the particles.

Figure 6E:
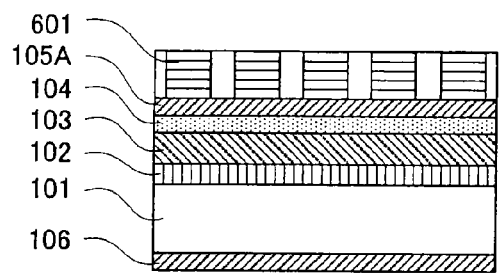
Figure 6B:
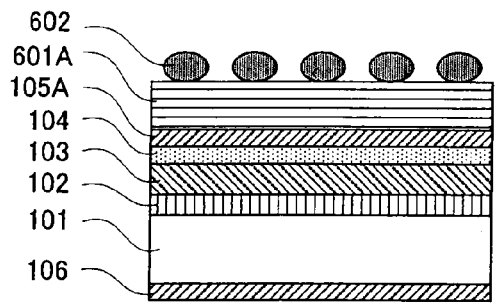
Figure 6F:
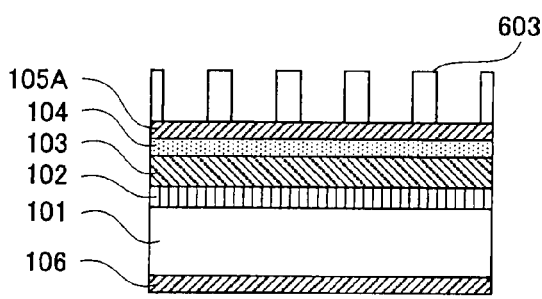
Figure 6C:
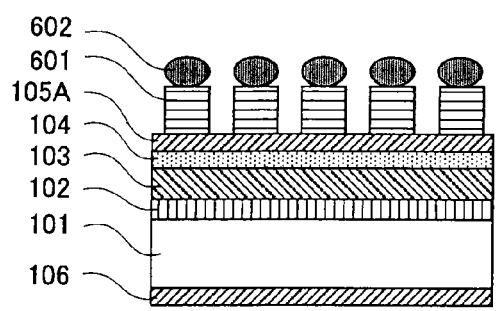

Subsequently, the resist layer was etched for 5 minutes by use of the silica particle layer as a mask under the conditions of $O_2$ flow: 30 sccm, pressure: 1.33 Pa (10 mTorr) and power: 100 W, to form a resist pillar pattern 601 (FIG. 6C).

Figure 6G:
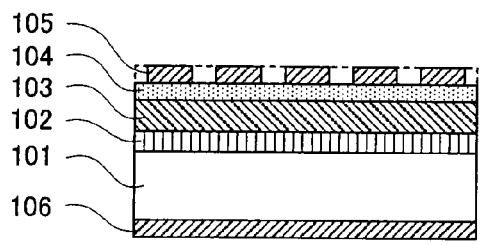
Figure 6D:
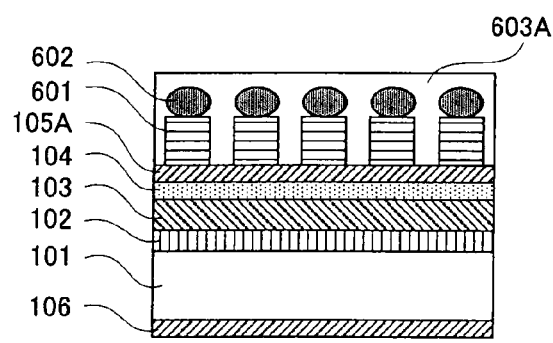

Onto the resist pillar pattern thus formed on the substrate, an organic SOG composition (OCD-T7 T-14000 [trademark], manufactured by TOKYO OHKA KOGYO CO., LTD.) was dropped and spin-coated at 2000 rpm for 60 seconds. After the spin-coating procedure, the solvent was completely removed by baking at 110° C. for 60 seconds. The layer thus formed was then annealed to harden at 250° C. for 1 hour, and thereby the resist pillar pattern was completely buried in the SOG layer 603A, and the surface thereof was leveled (FIG. 6D).

The leveled SOG layer was etched back for 10 minutes under the conditions of $CF_4$ flow: 30 sccm, pressure: 1.33 Pa (10 mTorr) and power: 100 W, to bare the top of the resist pillar pattern (FIG. 6E).

After that, the resist pillar pattern 601 was completely removed by etching for 3 minutes under the conditions of $O_2$ flow: 30 sccm, pressure: 1.33 Pa (10 mTorr) and power: 100 W, to form a hole pattern 603 of SOG (FIG. 6F).

Figure 6H:
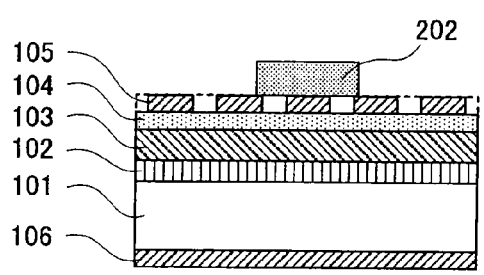

The Au/Au—Zn layer 105A was then etched for 90 seconds by means of an ion-milling machine under the conditions that the acceleration voltage and the ion current were 500 V and 40 mA, respectively, to form a metal electrode layer 105 provided with openings. After the etching procedure, the SOG was removed by immersing in 5% hydrofluoric acid solution (FIG. 6G). Finally, a pad electrode 202 was formed to obtain a semiconductor light-emitting device (FIG. 6H).

Independently, a comparative semiconductor light-emitting device was produced (Comparative Example 5). In the comparative device, a pad electrode connected to a fine wire was provided on the p-type GaAs layer. Each produced device was diced to be 1 mm square in size, and was comparatively evaluated in properties in the form of a bare chip. As a result, when the current was 1 A, the forward voltage of the device comprising the electrode provided with openings was 0.2 V smaller than that of the device comprising the fine wire-provided pad electrode. Further, when the current was 500 mA, the device of the electrode provided with openings emitted 1.3 times brighter luminescence than the device of the fine wire-provided pad electrode.

Example 6

A semiconductor light-emitting device having the structure of n-GaAs/n-InAlP/InGaP/p-InAlP/p-InGaAlP/p-GaAs, which was similar to the device of Example 1, was prepared. On the p-type GaAs layer 104, a metal thin layer 105A of Au (10 nm)/Au—Zn (3%) (10 nm) was formed by vapor deposition and thereafter annealed at 450° C. for 30 minutes in nitrogen gas atmosphere.

After that, the Au/Au—Zn layer 105A was spin-coated at 2000 rpm for 30 seconds with a solution of resist (THMR-iP3250 [trademark], manufactured by TOKYO OHKA KOGYO CO., LTD.) diluted at 1:3 with ethyl lactate (EL), and then heated on a hot-plate at 110° C. for 90 seconds to evaporate the solvent. The resist was annealed at 250° C. in nitrogen gas atmosphere to be thermally hardened. The resist layer 701A thus formed had a thickness of 100 nm.

Figure 7A:
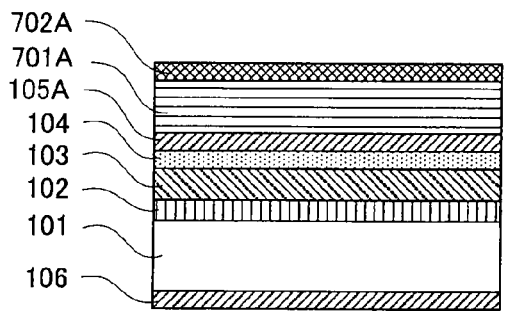
FIG. 7 A to F conceptually illustrate a process for production of the light-emitting device in Example 6.

Subsequently, the resist layer was spin-coated at 2000 rpm for 60 seconds with a solution of an organic SOG composition (OCD-T7 T-55000 [trademark], manufactured by TOKYO OHKA KOGYO CO., LTD.) diluted at 1:5 with ethyl lactate (EL). After the spin-coating procedure, the solvent was completely removed by baking at 110° C. for 60 seconds. The layer thus formed was then annealed to harden at 250° C. for 1 hour. The SOG layer 702A thus formed had a thickness of 30 nm (FIG. 7A).

Figure 7D:
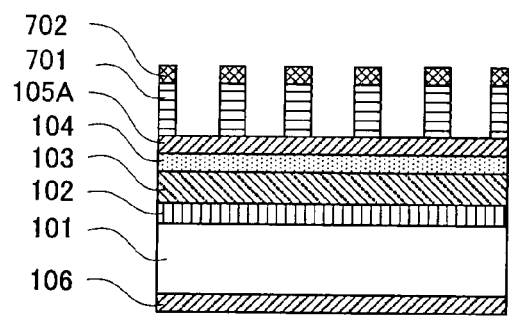
Figure 7B:
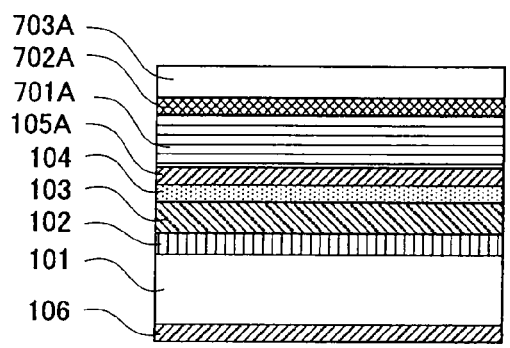
Figure 7E:
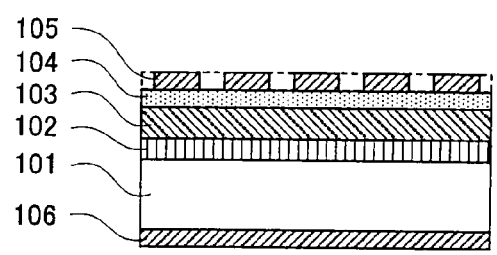
Figure 7C:
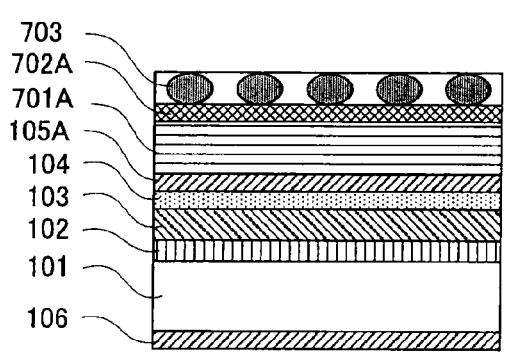

The SOG layer was further spin-coated at 3000 rpm with a solution of block polymer comprising 160000 molecular weight polystyrene (hereinafter, referred to as "PS") and 45000 molecular weight polymethyl methacrylate (hereinafter, referred to as "PMMA"), and then the solvent was removed by prebaking at 110° C. for 90 seconds to form a block copolymer layer 703A (FIG. 7B). Thereafter, the block copolymer layer was annealed at 210° C. for 4 hours in nitrogen gas atmosphere, so that the PS and PMMA were phase-separated to form a dot pattern 703 in which PMMA microdomains of 40 nm in size were arranged at intervals of 60 nm (FIG. 7C).

The block copolymer layer thus phase-separated was etched by RIE for 10 seconds under the conditions of $O_2$ flow: 30 sccm, pressure: 13.3 Pa (100 mTorr) and power: 100 W. Since the PS and PMMA had different etching rates, the PMMA was selectively etched to form a hole pattern of PS.

Thereafter, the underlying SOG layer was etched for 1 minute by use of the hole pattern of PS as a mask in RIE apparatus under the conditions of $CF_4$ flow: 30 sccm, pressure: 1.33 Pa (10 mTorr) and power: 100 W, to form a SOG hole pattern.

The resist layer was then etched for 60 seconds by use of the SOG hole pattern as a mask in RIE apparatus under the conditions of $O_2$ flow: 30 sccm, pressure: 1.33 Pa (10 mTorr) and power: 100 W, to form a resist hole mask (FIG. 7D).

Figure 7F:
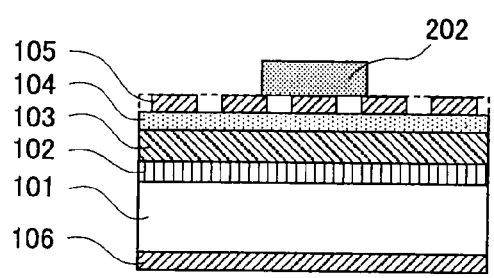

Subsequently, the Au/Au—Zn layer was etched for 100 seconds by means of an ion-milling machine under the conditions that the acceleration voltage and the ion current were 500 V and 40 mA, respectively, to form a metal electrode layer 105 provided with openings. After the etching procedure, the resist was removed by oxygen ashing (FIG. 7E). Finally, a pad electrode 202 was formed to obtain a semiconductor light-emitting device (FIG. 7F).

Independently, a comparative semiconductor light-emitting device was produced (Comparative Example 6). In the comparative device, a pad electrode connected to a fine wire was provided on the p-type GaAs layer. Each produced device was diced to be 1 mm square in size, and was comparatively evaluated in properties in the form of a bare chip. As a result, when the current was 1 A, the forward voltage of the device comprising the electrode provided with openings was 0.2 V smaller than that of the device comprising the fine wire-provided pad electrode. Further, when the current was 500 mA, the device of the electrode provided with openings emitted 1.35 times brighter luminescence than the device of the fine wire-provided pad electrode.

Example 7

A semiconductor light-emitting device having the structure of n-GaAs/n-InAlP/InGaP/p-InAlP/p-InGaAlP/p-GaAs, which was similar to the device of Example 1, was prepared. On the p-type GaAs layer 104, a metal thin layer 105A of Au (10 nm)/Au—Zn (3%) (40 nm) was formed by vapor deposition and thereafter annealed at 450° C. for 30 minutes in nitrogen gas atmosphere.

Figure 8A:
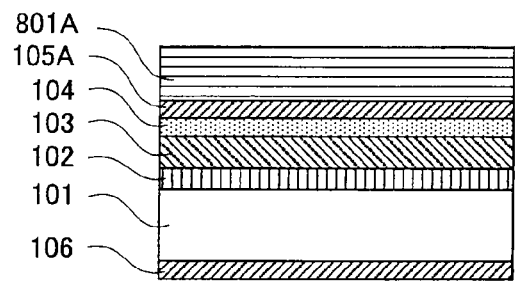
FIG. 8 A to F conceptually illustrate a process for production of the light-emitting device in Example 7.
Figure 8D:
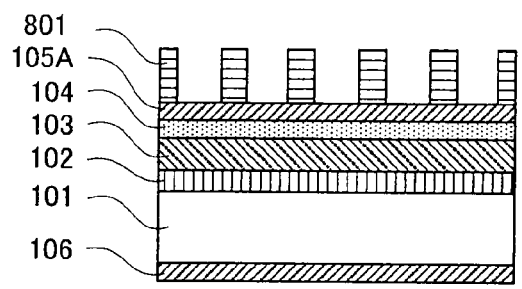
Figure 8B:
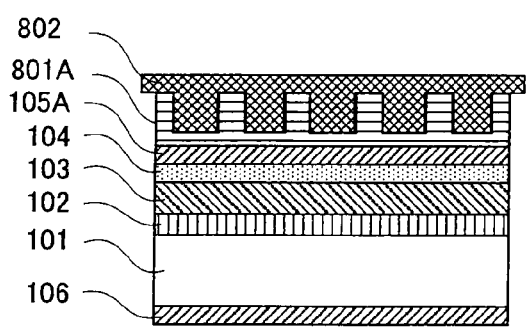

After that, the Au/Au—Zn layer was spin-coated at 2000 rpm for 30 seconds with a solution of resist (THMR-iP3250 [trademark], manufactured by TOKYO OHKA KOGYO CO., LTD.) diluted at 1:2 with ethyl lactate (EL), and then heated on a hot-plate at 110° C. for 90 seconds to evaporate the solvent. The resist layer 801A thus formed had a thickness of 150 nm (FIG. 8A). Independently, a quartz mold (stamper) 802 (9 cm$^2$) was prepared. On the quartz mold, a pattern was beforehand engraved positively so that pillars of 200 nm in size and 150 nm in height were arranged in intervals of 300 nm. While the substrate provided with the resist layer formed thereon in the above manner was heated at 120° C., the quartz mold was placed on the resist layer 801A so that the positively engraved pattern might be in contact with the resist layer, and was then put onto the resist layer 801A at a pressure of 10 MPa to perform imprinting (FIG. 8B). After the imprinting procedure, the substrate was cooled to room temperature and then the quartz mold was released from the resist layer.

Figure 8E:
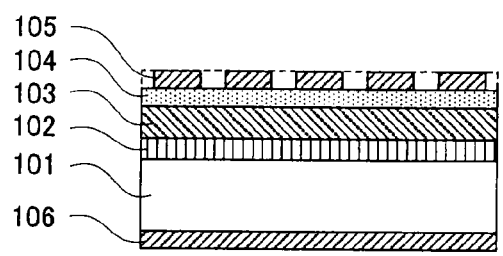
Figure 8C:
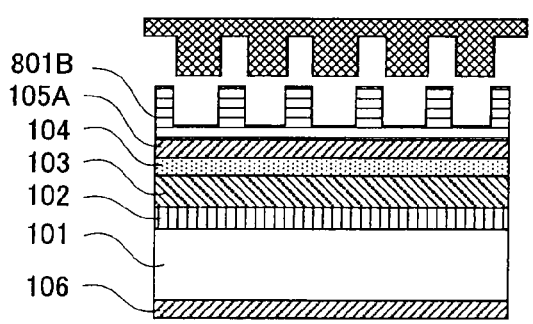

As a result of the imprinting procedure, a negative relief pattern 801B was formed on the resist pattern. In the formed pattern, holes of 200 nm in size and 150 nm in depth were arranged in intervals of 300 nm (FIG. 8C).

Subsequently, the negative relief resist pattern 801B thus formed was etched for 30 seconds under the conditions of $O_2$ flow: 30 sccm, pressure: 10 mTorr and RF power: 100 W. After the $O_2$ RIE procedure, the bottoms of the holes in the resist layer were removed to bare the Au/Au—Zn layer 105A (FIG. 8D).

Figure 8F:
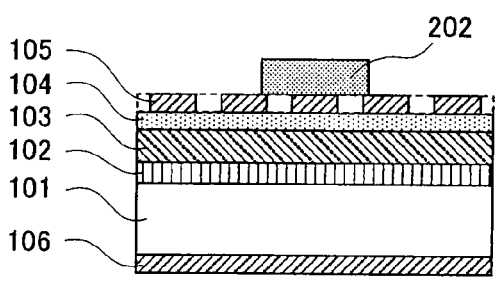

Thereafter, the Au/Au—Zn layer 105A was etched for 90 seconds by means of an ion-milling machine under the conditions that the acceleration voltage and the ion current were 500 V and 40 mA, respectively, to form a metal electrode layer provided with openings. After the etching procedure, the resist was removed by oxygen ashing (FIG. 8E). Finally, a pad electrode 202 was formed to obtain a semiconductor light-emitting device (FIG. 8F).

Independently, a comparative semiconductor light-emitting device was produced (Comparative Example 7). In the comparative device, a pad electrode connected to a fine wire was provided on the p-type GaAs layer. Each produced device was diced to be 1 mm square in size, and was comparatively evaluated in properties in the form of a bare chip. As a result, when the current was 1 A, the forward voltage of the device comprising the electrode provided with openings was 0.2 V smaller than that of the device comprising the fine wire-provided pad electrode. Further, when the current was 500 mA, the device of the electrode provided with openings emitted 1.3 times brighter luminescence than the device of the fine wire-provided pad electrode.

Example 8

Figure 9A:
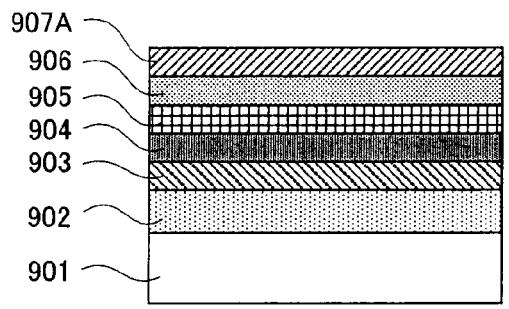
FIG. 9 A to E conceptually illustrate a process for production of the light-emitting device in Example 8.

As shown in FIG. 9A, a GaN buffer layer 902 was formed on a sapphire substrate 901. On the GaN buffer layer 902, an n-GaN:Si layer 903, a multi-quantum well (MQW) layer 904 of INGaN/GaN, a p-$Al_{0.2}Ga_{0.8}N$:Mg layer 905, and a p-GaN:Mg layer 906 were epitaxially grown to be formed in order. After that, a layer 907A of Ni (10 nm)/Au (40 nm) was formed on the p-GaN:Mg layer by vapor deposition, and then subjected to rapid high temperature annealing so as to ensure ohmic contact.

Figure 9D:
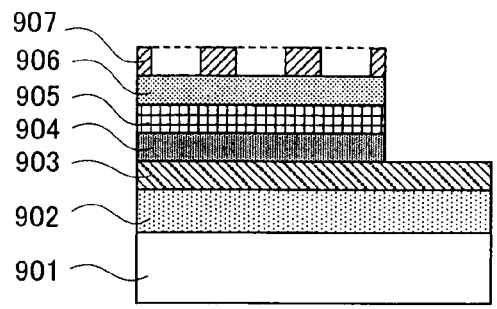
Figure 9B:
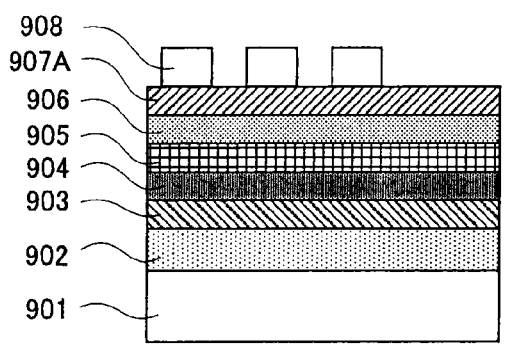

After that, an electron beam resist layer was formed on the Ni/Au layer 907A in the same manner as in Example 1, and treated by use of a pattern generator, to form a hole pattern 908 in which the diameter and interval of openings were 100 nm and 200 nm, respectively (FIG. 9B).

Figure 9E:
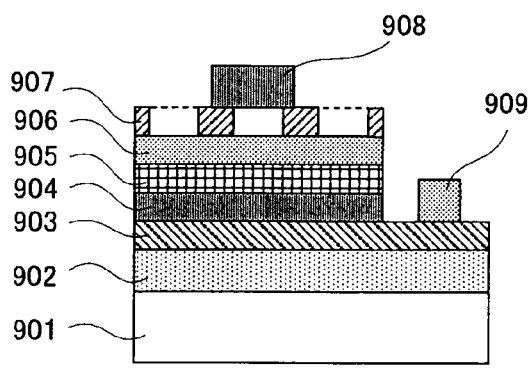
Figure 9C:
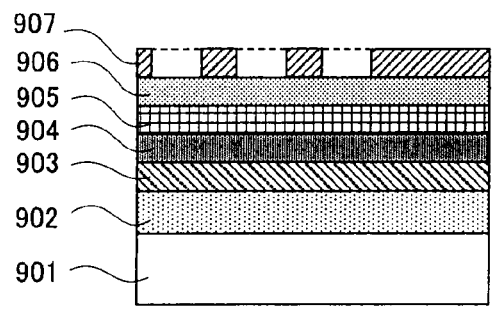

Subsequently, the Ni/Au layer was etched for 120 seconds by means of an ion-milling machine under the conditions that the acceleration voltage and the ion current were 500 V and 40 mA, respectively, to form a metal electrode layer 907 provided with openings. After the etching procedure, the resist was removed by oxygen ashing (FIG. 9C).

Thereafter, the n-GaN layer was partly bared by patterning so as to form a space for an electrode on the n-GaN layer (FIG. 9D). Finally, n-type and p-type pad electrodes 909 and 908, respectively, were formed to obtain a semiconductor light-emitting device (FIG. 9E).

The obtained device emitted luminescence at 450 nm.

Independently, a comparative semiconductor light-emitting device was produced (Comparative Example 8). In the comparative device, a pad electrode of Ni (10 nm)/Au (40 nm) connected to a fine wire was provided on the p-GaN:Mg layer. Each produced device was diced to be 1 mm square in size, and was comparatively evaluated in properties in the form of a bare chip. As a result, when the current was 1 A, the forward voltage of the device comprising the electrode provided with openings was 0.25 V smaller than that of the device comprising the fine wire-provided pad electrode. Further, when the current was 500 mA, the device of the electrode provided with openings emitted 1.25 times brighter luminescence than the device of the fine wire-provided pad electrode.

It was thus verified that, even if adopting GaN-type compound semiconductors, the device of the present invention exhibited superior performance.

Example 9

A semiconductor light-emitting device comprising a sapphire substrate 901, a GaN buffer layer 902, an n-GaN:Si layer 903, a MQW layer of InGaN/GaN 904, a p-$Al_{0.2}Ga_{0.8}N$:Mg layer 905 and a p-GaN:Mg layer 906, which was similar to the device of Example 8, was prepared. After that, a Ni (10 nm)/Au (40 nm) layer 907A was formed on the p-GaN:Mg layer by vapor deposition, and then subjected to rapid high temperature annealing so as to ensure ohmic contact.

Figure 10A:
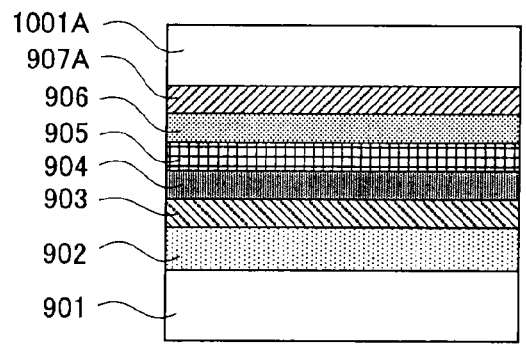
FIG. 10 A to F conceptually illustrate a process for production of the light-emitting device in Example 9.
Figure 10D:
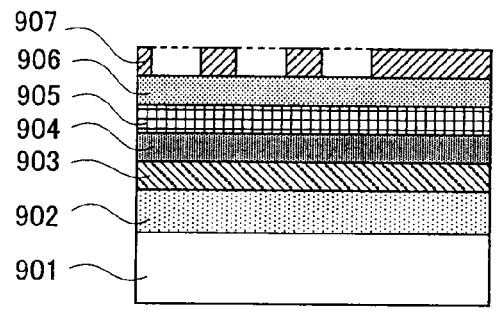
Figure 10B:
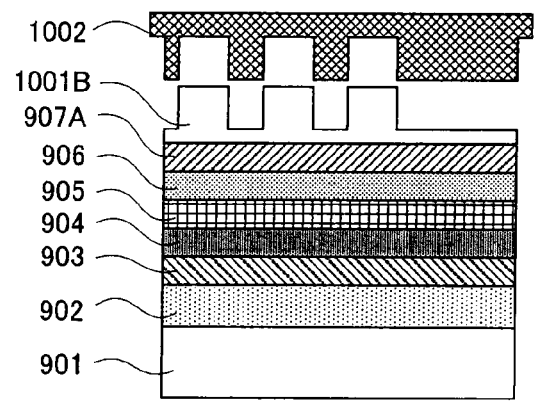

After that, the Ni/Au layer was spin-coated at 2000 rpm for 30 seconds with a solution of resist (THMR-iP3250 [trademark], manufactured by TOKYO OHKA KOGYO CO., LTD.) diluted at 1:2 with ethyl lactate (EL), and then heated on a hot-plate at 110° C. for 90 seconds to evaporate the solvent to form a resist layer 1001A, which had a thickness of 150 nm (FIG. 10A). Independently, a quartz mold 1002 (9 $cm^2$) was prepared. On the quartz mold, a pattern was beforehand engraved positively so that pillars of 200 nm in size and 150 nm in height were arranged in intervals of 300 nm. While the substrate provided with the resist layer formed thereon in the above manner was heated at 120° C., the quartz mold was placed on the resist layer so that the positively engraved pattern might be in contact with the resist layer, and was then put onto the resist layer at a pressure of 10 MPa to perform imprinting. After the imprinting procedure, the substrate was cooled to room temperature and then the quartz mold 1002 was released from the resist layer. As a result of the imprinting procedure, a negative relief pattern 1001B was formed on the resist pattern. In the formed pattern, holes of 200 nm in size and 100 nm in depth were arranged in intervals of 300 nm (FIG. 10B).

Subsequently, the negative relief resist pattern thus formed was etched for 30 seconds under the conditions of $O_2$ flow: 30 sccm, pressure: 10 mTorr and RF power: 100 W. After the $O_2$ RIE procedure, the bottoms of the holes in the resist layer were removed to bare the Ni/Au layer to form a resist pattern 1001 (FIG. 10C).

The Ni/Au layer was then etched via the resist pattern 1001 for 120 seconds by means of an ion-milling machine under the conditions that the acceleration voltage and the ion current were 500 V and 40 mA, respectively, to form a metal electrode layer 907 provided with openings. After the etching procedure, the resist was removed by oxygen ashing (FIG. 10D).

Figure 10E:
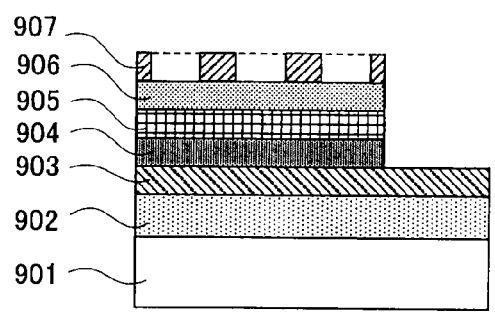
Figure 10C:
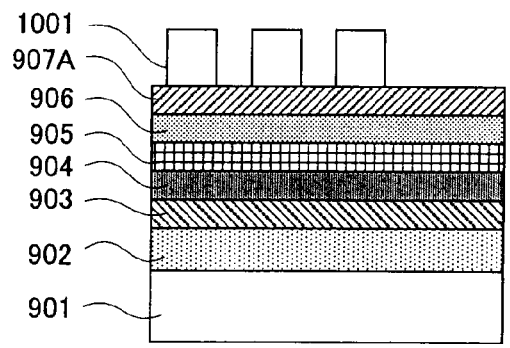
Figure 10F:
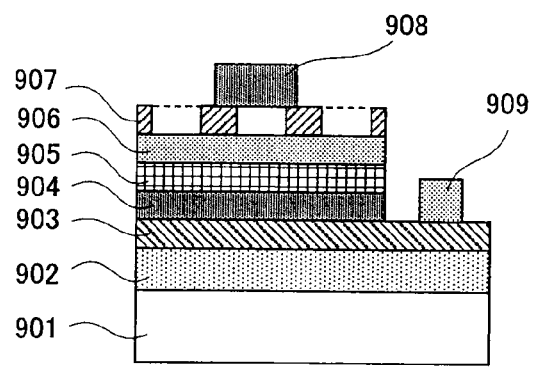

Thereafter, the n-GaN layer was partly bared by patterning so as to form a space for an electrode on the n-GaN layer (FIG. 10E). Finally, n-type and p-type pad electrodes 909 and 908, respectively, were formed to obtain a semiconductor light-emitting device (FIG. 10F).

Independently, a comparative semiconductor light-emitting device was produced (Comparative Example 10). In the comparative device, a pad electrode of Ni (10 nm)/Au (40 nm) connected to a fine wire was provided on the p-GaN:Mg layer. Each produced device was diced to be 1 mm square in size, and was comparatively evaluated in properties in the form of a bare chip. As a result, when the current was 1 A, the forward voltage of the device comprising the electrode provided with openings was 0.2 V smaller than that of the device comprising the fine wire-provided pad electrode. Further, when the current was 500 mA, the device of the electrode provided with openings emitted 1.2 times brighter luminescence than the device of the fine wire-provided pad electrode.

The invention claimed is:

1. A semiconductor light-emitting device comprising:
   a crystal substrate;
   an electrode layer having an area of 1 $mm^2$ or more provided on one surface of the substrate;
   a compound semiconductor layer provided on another surface of the electrode layer; and
   a metal electrode layer which is provided on the compound semiconductor layer and which has a thickness of 10 nm to 200 nm;
   wherein an interface between the metal layer and the compound semiconductor layer includes a dopant;
   the metal electrode layer comprises:
      a metal part so continuous that any pair of point-positions therein is continuously connected without breaks and
   plural openings penetrating through the metal electrode layer and having a mean diameter of 10 nm to 2 μm and an opening ratio, defined as a ratio of a total area occupied by the openings based on the whole metal electrode area, of 40 to 70%, said plural openings being arranged periodically, and
   wherein the metal electrode layer is made of at least one metal or an alloy selected from the group consisting of Au, Ag, Al, Zn, Zr, Ge, Pt, Ni, W, Pd and Rh.

2. The device according to claim 1, wherein the metal electrode layer keeps in ohmic contact with the compound semiconductor layer.

3. The device according to claim 1, wherein the metal electrode layer has a light-transmittance of 10% or more at a wavelength of luminescence emitted by the compound semiconductor layer.

4. The device according to claim 1, wherein said dopant is Zn.

* * * * *